United States Patent [19]
Uchiya

[11] Patent Number: 6,114,717
[45] Date of Patent: Sep. 5, 2000

[54] SOLID-STATE IMAGING DEVICE HAVING NO TRANSFER ERROR OF THE SIGNAL CHARGES FROM VERTICAL HORIZONTAL CHARGE-TRANSFER SECTION

[75] Inventor: Satoshi Uchiya, Tokyo, Japan

[73] Assignee: NEC Corporation, Tokyo, Japan

[21] Appl. No.: 08/960,803

[22] Filed: Oct. 30, 1997

[30] Foreign Application Priority Data

Oct. 30, 1996  [JP]  Japan ................................... 8-288475

[51] Int. Cl.[7] ........................ H01L 27/148; H01L 29/768
[52] U.S. Cl. .......................... 257/232; 257/231; 257/233; 257/241
[58] Field of Search .................................. 257/231, 232, 257/233, 241

[56] References Cited

U.S. PATENT DOCUMENTS

| 4,987,466 | 1/1991 | Shibata et al. | |
| 5,196,719 | 3/1993 | Miwada | 257/233 |
| 5,220,185 | 6/1993 | Wada | 257/239 |
| 5,323,034 | 6/1994 | Furumiya | 257/232 |
| 5,589,698 | 12/1996 | Nakashiba | 257/231 |
| 5,770,870 | 6/1998 | Nakashiba | 257/230 |

FOREIGN PATENT DOCUMENTS

7-38083  2/1995  Japan .

OTHER PUBLICATIONS

Furumiya, M. et al., "FA 11.5: A 30Frame/s 2/3 Inch 1.3M Pixel Progressive Scan IT–CCD Image Sensor", 1997 IEEE International Solid–State Circuits Conference, ISSCC97/Session 11/Imaging Circuits and Systems/Paper FA 11.5.

Yamaguchi, T. et al., "A 1/3–inch 330k Square–Pixel Progressive–Scan IT–CCD", 1995 IEEE Workshop on Charge–Coupled Devices and Advanced Image Sensors, Apr. 20–22, 1995, IEEE Electron Devices Society.

*Primary Examiner*—Ngân V. Ngô
*Attorney, Agent, or Firm*—Hutchins, Wheeler & Dittmar

[57] ABSTRACT

A solid-state imaging device that prevents the transfer errors of the signal charges from vertical charge-transfer sections to a horizontal charge-transfer section. A first plurality of buried channel regions in vertical charge-transfer sections are connected to a second buried channel region in a horizontal charge-transfer section so that the interfaces between the first plurality of buried channel regions and the second buried channel region are located to be aligned with the corresponding ends of the first plurality of gate electrodes. Thus, no potential dip nor potential barrier are generated in the vicinity of the interfaces between the first plurality of buried channel regions and the second buried channel region.

7 Claims, 14 Drawing Sheets

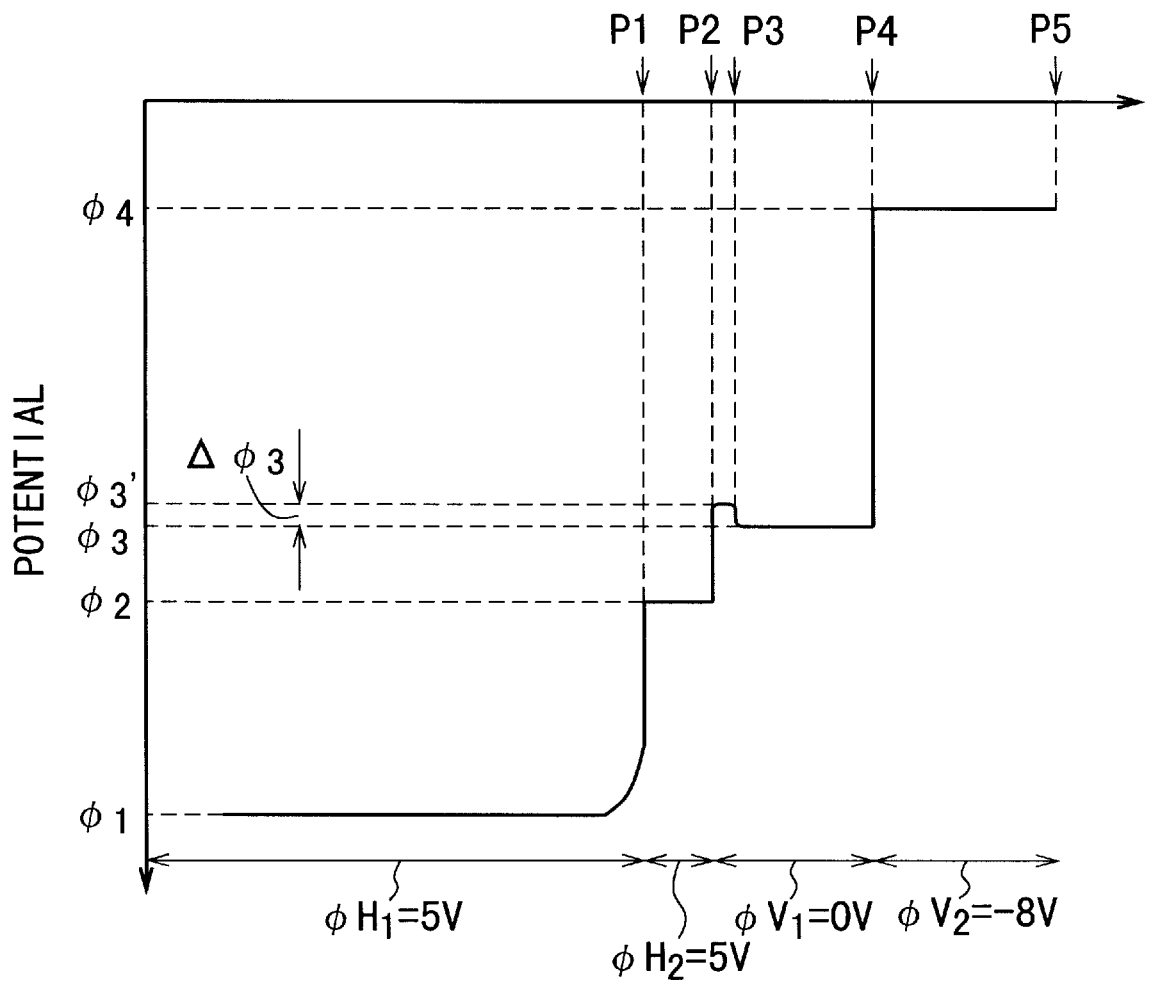

SOLID-STATE IMAGING DEVICE HAVING NO TRANSFER ERROR OF THE SIGNAL CHARGES FROM VERTICAL HORIZONTAL CHARGE-TRANSFER SECTION

BACKGROUND OF THE INVENTION

1. Field of the Invention

The present invention relates to a solid-state imaging device and more particularly, to a two-dimensional solid-state imaging device that prevents transmission errors during a signal-charge transfer process from vertical charge-transfer sections to a horizontal charge-transfer section, and a fabrication method of the device.

2. Description of the Prior Art

FIG. 1 schematically shows a plan view of one of photoelectric conversion sections and its neighborhood of a conventional two-dimensional solid-state imaging device of the progressive-scan interline-transfer type. FIGS. 2 and 3 schematically show cross-sectional views along the lines II—II and III—III in FIG. 1, respectively. FIG. 4 schematically shows a plan view of an interconnection area between one of single-channel vertical charge-transfer sections and a single-channel horizontal charge-transfer section. FIGS. 5 and 6 schematically show cross-sectional views along the lines V—V and VI—VI in FIG. 4, respectively.

As shown in FIGS. 1 and 4, rectangular photoelectric conversion sections 151 are arranged in a matrix array. Elongated vertical charge-transfer sections 152 are arranged along the respective columns of the matrix array. An elongated horizontal charge-transfer section 153 is disposed at the output-side ends of the vertical charge-transfer sections 152 to extend along the rows of the matrix array. An output section, which is disposed at the output-side end of the horizontal charge-transfer section 153, is now shown here.

Each of the vertical charge-transfer sections 152 is formed by a vertical Charge-Coupled Device (CCD) register. The horizontal charge-transfer section 153 is formed by a horizontal CCD register.

As shown in FIGS. 2, 3, 5, and 6, p-type wells 102, 103, and 104 are formed in a surface region of an n-type silicon substrate 101. The elongated p-type well 102 is formed in the horizontal charge-transfer section 153 to extend along the section 153. The rectangular p-type wells 103 are located in the respective photoelectric conversion sections 151. The elongated p-type wells 104 are located in the respective vertical charge-transfer sections 152 to extend along the corresponding sections 152.

The p-type wells 102 in the horizontal charge-transfer section 153 have a depth large enough for preventing the punch-through phenomenon from occurring in source/drain regions of Metal-oxide-Semiconductor Field-Effect Transistors (MOSFETs) provided in the output section. The p-type wells 102 is deeper than the p-type wells 103 and 104. The p-type wells 102 have a doping concentration lower than that of the p-type wells 104 for the purpose of allowing to drive the horizontal charge-transfer section 153 by using a low-voltage and high-frequency driving signal.

The p-type wells 103 in the photoelectric conversion sections 151 have a low doping concentration to allow the so-called "electronic shutter" operation, which is defined as an operation that the signal charges stored in photodiodes 130 in the sections 151 are transferred to the remaining substrate 101 when a specific voltage is applied to the substrate 101.

The p-type wells 104 in the vertical charge-transfer sections 152 have a higher doping concentration than that of the wells 103 so that the signal charges in the vertical charge-transfer sections 152 do not flow into the remaining substrate 101 at the time the electronic shutter operation is performed.

In the photoelectric conversion sections 151, as shown in FIGS. 1 and 2, rectangular n-type diffusion regions 108 are formed in the respective p-type wells 103. Each of the n-type diffusion regions 108 and a corresponding one of the remaining p-type wells 103 constitute the photodiode 130.

In the vertical charge-transfer sections 152, as shown in FIGS. 1 to 3, elongated n-type buried channel regions 105 are formed in the respective p-type wells 104 to extend along the corresponding wells 104.

In the horizontal charge-transfer sections 153, as shown in FIGS. 4 and 5, n-type buried channel regions 106 and 107 are formed in the p-type well 102. The buried channel regions 106 and 107 are alternately arranged along the well 102. The buried channel regions 106 serve as charge-storage regions for storing the signal charges. The buried channel regions 107 serve as charge-barrier regions for confining the signal charges in the adjoining charge-storage regions.

The n-type buried channel regions 106 have a doping concentration slightly greater than that of the n-type buried channel regions 107. The doping concentrations of the n-type buried channel regions 106 and 107, which are determined according to the doping concentration of the corresponding p-type well 102, are less than that of the n-type buried channel regions 105.

P-type diffusion regions 109 and 110 are formed in the surface region of the substrate 101 at the respective interfaces between the p-type wells 103 and 104, as shown in FIG. 2. The p-type diffusion regions 109 serve as channel stops. The p-type diffusion regions 110 serve as parts of read-out gates for transferring the signal charges in the photodiodes 130 to the corresponding vertical charge-transfer sections 152. The p-type diffusion regions 109 have a high doping concentration. The p-type diffusion regions 110 have a low doping concentration.

A gate oxide film 111 is formed on the surface of the substrate 101 to cover the photoelectric conversion sections 151, the vertical charge-transfer sections 152, and the horizontal charge-transfer section 153.

First, second, and third patterned polysilicon films 112, 113, and 114 are formed on the gate oxide film 111 in the photoelectric conversion sections 151 and the vertical and horizontal charge-transfer sections 152 and 153. These polysilicon films 112, 113, and 114 serve as gate electrodes and wiring lines. Parts of the polysilicon films 112, 113, and 114 which are contacted with the gate oxide film 111 serve as the gate electrodes. Parts of the polysilicon films 112, 113, and 114 which are not contacted with the gate oxide film 111 serve as the wiring lines.

The p-type diffusion region 110, the corresponding gate electrode, and the gate oxide film 111 in each of the photoelectric conversion sections 151 constitute the read-out gate. The buried channel region 105, the corresponding gate electrodes, and the gate oxide film 111 in each of the vertical charge-transfer sections 152 constitute the vertical CCD register driven by a four-phase driving signal. The buried channel region 102, the corresponding gate electrodes, and the gate oxide film 111 in the horizontal charge-transfer section 153 constitute the horizontal CCD register driven by a two-phase driving signal.

In the vertical and horizontal charge-transfer sections 152 and 153, the second polysilicon film 113 is partially overlapped with the underlying first polysilicon film 112.

Further, the third polysilicon film 114 is partially overlapped with the underlying first and second polysilicon films 112 and 113. The second polysilicon film 113 is electrically insulated from the first polysilicon film 112 by an intervening gate oxide film 111a. The third polysilicon film 114 is electrically insulated from the underlying first polysilicon film 112 by the gate oxide film 111a and from the underlying second polysilicon film 113 by a gate oxide film 111b.

An interlayer insulating film 115 is formed to cover the first, second, and third polysilicon films 112, 113, and 114 in the photoelectric conversion sections 151 and the vertical and horizontal charge-transfer sections 152 and 153.

A metal film 116 is formed on the interlayer insulating film 115 in the photoelectric conversion sections 151 and the vertical and horizontal charge-transfer sections 152 and 153. As shown in FIGS. 1 and 2, the metal film 116 has rectangular windows 116a located in the respective photoelectric conversion sections 151 to allow the incident light to enter the photodiodes 130. The metal film 116 serves as a light shielding film and a wiring line or lines.

A cover oxide film 117 is formed on the metal film 116 in the photoelectric conversion sections 151 and the vertical and horizontal charge-transfer sections 152 and 153 to protect the inner layered structures.

A fabrication method of the above conventional solid-state imaging device is explained below with reference to FIGS. 7A to 7C showing the same cross sections as that in FIG. 6.

First, as shown in FIG. 7A, the p-type wells 102, which are located in the horizontal charge-transfer section 153, are formed in the surface region of the n-type silicon substrate 101. Then, the p-type wells 103, which are located in the photoelectric conversion sections 151, are formed in the surface region of the substrate 101. Further, the p-type wells 104, which are located in the vertical charge-transfer sections 152, are formed in the surface region of the substrate 101.

Subsequently, phosphorus (P) ions are selectively implanted into the p-type wells 103 as an n-type impurity, forming the n-type diffusion regions 108 in the photoelectric conversion regions 151. Boron (B) ions are selectively implanted into the interfaces between the p-type wells 103 and 104 and their neighborhood as a p-type impurity, forming the p-type channel stop regions 109 and the p-type read-out gate regions 110.

Next, phosphorus ions are selectively implanted into the p-type wells 104 and 102 in the vertical and horizontal charge-transfer sections 152 and 153, forming an n-type region 106' in the vertical and horizontal charge-transfer sections 152 and 153. The state at this stage is shown in FIG. 7A.

After a patterned resist film 118 uncovering the vertical charge-transfer sections 152 only is formed on the substrate 101, phosphorus ions are selectively implanted into the n-type region 106' again using the resist film 118 as a mask, forming the n-type buried channel regions 105 having the doping concentration grater than that of the remaining n-type region 106' in the vertical charge-transfer sections 152, as shown in FIG. 7B. The resist film 118 is then removed.

The resist film 118 is designed so that the interface 120 between each of the n-type buried channel regions 105 and the remaining n-type region 106' is located just below a corresponding end 112a of the polysilicon film 112 near the interface between the vertical charge-transfer sections 151 and the horizontal charge-transfer section 152.

Following this, the gate oxide film 111 is formed on the substrate 101 to cover the photoelectric conversion sections 151 and the vertical and horizontal charge-transfer sections 152 and 153, as shown in FIG. 7C.

The first patterned polysilicon film 112 is then formed on the gate oxide film 111. The first polysilicon film 112 serves as the gate electrodes for applying one of the four driving voltages to the vertical CCD registers in the vertical charge-transfer sections 152 and the gate electrodes for applying one of the two driving voltages to the horizontal CCD register in the horizontal charge-transfer section 153. These gate electrodes in the horizontal charge-transfer section 153 are located on the n-type buried channel regions 106 serving as the charge-storage regions.

Moreover, a patterned resist film (not shown) uncovering the horizontal charge-transfer section 153 only is formed on the gate oxide film 111. Then, boron ions are selectively implanted into the remaining n-type region 106' again to decrease the doping concentration using the resist film and the polysilicon film 112 as a mask, forming the n-type buried channel regions 107. The non-implanted parts of the remaining n-type region 106' during this process constitute the n-type buried channel regions 106. The n-type buried channel regions 106 and 107 are alternately arranged along the horizontal charge-transfer section 153.

Since the boron ions as a p-type impurity are implanted into the remaining n-type region 106', the n-type buried channel regions 106 serving as the charge-storage regions are greater in doping concentration than the n-type buried channel regions 107 serving as the charge-barrier regions.

Subsequently, the gate oxide film 111a is selectively formed on the surface of the first polysilicon film 112, and then, the second patterned polysilicon film 113 is formed on the gate oxide films 111 and 111a, as clearly shown in FIGS. 3, 5, and 6. The second patterned polysilicon film 113 serves as the gate electrodes for applying remaining two ones of the four driving voltages to the vertical CCD registers in the vertical charge-transfer sections 152 and the gate electrodes for applying another one of the two driving voltages to the horizontal CCD register in the horizontal charge-transfer section 153. These gate electrodes in the horizontal charge-transfer section 153 are located on the n-type buried channel regions 107 serving as the charge-barrier regions.

The gate oxide film 111b is selectively formed on the surface of the second polysilicon film 113, and then, the third patterned polysilicon film 114 is formed on the gate oxide films 111, 111a, and 111b, as clearly shown in FIGS. 2, 3, 5, and 6. The third patterned polysilicon film 114 serves as the gate electrodes for applying the remaining one of the four driving voltages to the vertical CCD registers in the vertical charge-transfer sections 152 and the read-out gates in the photoelectric conversion section 151.

Following this step, the interlayer insulating film 115 is formed to cover the photoelectric conversion section 151 and the vertical and horizontal charge-transfer sections 152 and 153. The metal film 116 serving as the light-shield and the wiring line is formed on the interlayer insulating film 115. The cover oxide film 117 is formed on the metal film 116.

Thus, the conventional solid-state imaging device shown in FIGS. 1 to 6 is fabricated.

The conventional solid-state imaging device has the following problem.

Specifically, the interfaces 120 between the n-type buried channel regions 105 and 106 are defined by using the resist film 118 during the boron-ion-implantation process shown in FIG. 7C. Also, the n-type buried channel regions 107 are formed by a subsequent boron-ion-implantation process using the first polysilicon film 11 as a mask. Therefore, as shown in FIG. 7C, the interfaces 121 and 122 of the region 107 located at the interconnection area of each of the vertical charge-transfer sections 152 and the horizontal charge-transfer section 153 tends to fluctuate. This fluctuation is caused by (a) the placement error of the resist film 118 for the phosphorus-ion-implantation process shown in FIG. 7B, (b) the overlay error of the resist film for the first polysilicon film 112 shown in FIG. 7B, and (c) the dimension error of the first polysilicon film 112 during the etching or patterning process.

For example, when the interfaces 120 are shifted to be located below the first polysilicon film 112, as shown in FIG. 6, n-type regions 106" are formed between the respective n-type buried channel regions 105 and 107. In this case, the n-type regions 106, 107, 106", and 105 have an electric potential as shown in FIG. 8. In FIG. 8, $H_1$ and $H_2$ are the two-phase driving voltages for the horizontal charge-transfer sections 153 and $V_1$ and $V_2$ are two ones of the four-phase driving voltages for the vertical charge-transfer sections 152. The points P1, P2, P3, P4, and P5 are defined as shown in FIG. 6.

It is seen from FIG. 8 that a potential barrier having a potential difference $\Delta\phi3$ is generated in the n-type regions 106" between the points P2 and P3.

On the other hand, when the interfaces 120 are shifted to be located below the windows of the first polysilicon film 112, as shown in FIG. 9, n-type regions 105' are formed between the respective n-type buried channel regions 105 and 107. The n-type regions 106, 107, 105', and 105 have an electric potential as shown in FIG. 10.

It is seen from FIG. 10 that a potential dip having a potential difference $\Delta\phi2$ is generated in the n-type region 105' between the points P2 and P3.

The above potential barrier and dip will cause some transfer error of the signal charges during the transfer process from the vertical charge-transfer sections 152 to the horizontal charge-transfer section 153.

SUMMARY OF THE INVENTION

Accordingly, an object of the present invention is to provide a solid-state imaging device that prevents any transfer error during the transfer process from vertical charge-transfer sections to a horizontal charge-transfer section, and a fabrication method of the device.

The above object together with others not specifically mentioned will become clear to those skilled in the art from the following description.

According to a first aspect of the present invention, a solid-state imaging device is provided. This device is comprised of photoelectric converter elements arranged in a matrix array, vertical charge-transfer sections arranged along respective columns of the matrix array, a horizontal charge-transfer section disposed at the output-side ends of the vertical charge-transfer sections, and an output section disposed at the output-side end of the horizontal charge-transfer section.

The photoelectric converter elements convert incident light to electric signal charges. The vertical charge-transfer sections transfer the signal charges to the horizontal charge-transfer section according to a first driving signal. The horizontal charge-transfer section transfers the signal charges to the output section according to a second driving signal, generating an output electric signal.

The vertical charge-transfer sections include a first plurality of buried channel regions extending along the respective vertical charge-transfer sections and a first plurality of gate electrodes arranged along the respective vertical charge-transfer sections over the first plurality of buried channel regions.

The horizontal charge-transfer section includes a second buried channel region extending along the horizontal charge-transfer section and a second plurality of gate electrodes arranged along the horizontal charge-transfer section over the second buried channel region.

The second buried channel region has a different doping concentration from that of the first plurality of buried channel regions. The first plurality of buried channel regions are connected to the second buried channel region so that interfaces between the first plurality of buried channel regions and the second buried channel region are located to be aligned with corresponding ends of the first plurality of gate electrodes.

With the solid-state imaging device according to the first aspect of the present invention, the first plurality of buried channel regions in the vertical charge-transfer sections are connected to the second buried channel region in the horizontal charge-transfer section so that the interfaces between the first plurality of buried channel regions and the second buried channel region are located to be aligned with the corresponding ends of the first plurality of gate electrodes.

Therefore, no potential dip nor potential barrier are generated in the vicinity of the interconnection areas between the first plurality of buried channel regions and the second buried channel region. This means that no transfer error of the signal charges will occur during the transfer process from the vertical charge-transfer sections to the horizontal charge-transfer section.

According to a second aspect of the present invention, a fabrication method of the solid-state imaging device according to the first aspect is provided. This method is comprised of the following steps.

A first step is to form a diffusion region of a first conductivity type in a surface region of a semiconductor substrate. The diffusion region has a pattern for the vertical charge-transfer sections and the horizontal charge-transfer section.

A second step is to form a gate oxide film on the surface region of the substrate.

A third step is to form gate electrodes on the gate oxide film to be arranged along the respective vertical charge-transfer sections.

A fourth step is to form a patterned masking film to cover the vertical charge-transfer sections and to uncover the horizontal charge-transfer section. Ends of the gate electrodes are exposed from the masking film.

A fifth step is to selectively ion-implant a dopant of the first conductivity type into the diffusion region using the masking film and the gate electrodes, forming a first plurality of buried channel regions in the respective vertical charge-transfer regions and a second buried channel region in the horizontal charge-transfer region.

Thus, interfaces between the first plurality of buried channel regions and the second buried channel region are determined in self-alignment with the ends of the gate electrodes, respectively.

With the fabrication method according to the second aspect of the present invention, the dopant of the first conductivity type are selectively ion-implanted into the diffusion region using the masking film and the gate electrodes in the fifth step, thereby forming the first plurality of buried channel regions in the respective vertical charge-transfer regions and the second buried channel region in the horizontal charge-transfer region. Therefore, the interfaces between the first plurality of buried channel regions and the second buried channel region are determined in self-alignment with the ends of the gate electrodes, respectively.

As a result, the solid-state imaging device according to the first aspect is fabricated.

BRIEF DESCRIPTION OF THE DRAWINGS

In order that the present invention may be readily carried into effect, it will now be described with reference to the accompanying drawings.

FIG. 8 is a diagram showing the relationship of the electric potential with the position of the conventional solid-state imaging device in FIG. 1 to 6.

DETAILED DESCRIPTION OF THE PREFERRED EMBODIMENTS

A preferred embodiment of the present invention will be described below with reference to FIGS. 11 to 16.

Figure 16:
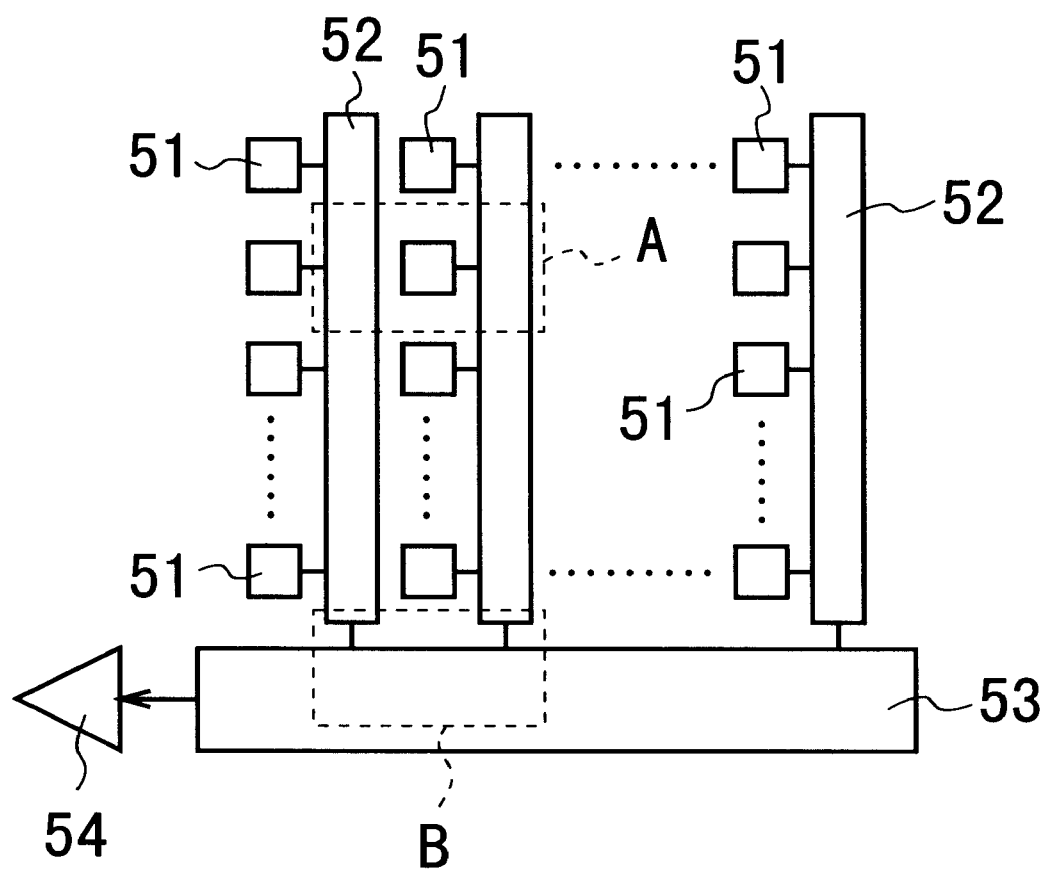
FIG. 16 is a schematic plan view showing the entire configuration of the solid-state imaging device according to the embodiment of the present invention.

A two-dimensional solid-state imaging device according to an embodiment of the present invention, which is of the progressive-scan interline-transfer type, has a configuration as shown in FIG. 16.

In FIG. 16, rectangular photoelectric conversion sections 51 are arranged in a matrix array. Elongated vertical charge-transfer sections 52 are arranged along respective columns of the matrix array. An elongated horizontal charge-transfer section 53 is disposed at the output-side ends of the vertical charge-transfer sections 52 to extend along rows of the matrix array. An output section 54 is disposed at the output-side end of the horizontal charge-transfer section 53.

Each of the photoelectric conversion sections 51 includes a photodiode as a photoelectric converter element. Each of the vertical charge-transfer sections 52 is formed by a vertical CCD register. The horizontal charge-transfer section 53 is formed by a horizontal CCD register.

The photodiodes in the photoelectric conversion sections 51 receive incident light to generate electric signal charges according to the intensity of the received light. The signal charges are temporality stored in the corresponding photodiodes and then, they are successively read out to the corresponding vertical charge-transfer sections 52 according to a pulsed driving signal. The read-out signal charges in every row of the matrix array are successively transferred to the horizontal charge-transfer section 53 by the vertical charge-transfer sections 52 according to the driving signal. The transferred signal charges to the horizontal charge-transfer section 53 are successively transferred to the output section 54 by the horizontal charge-transfer section 53 according to another pulsed driving signal, generating an output electric signal.

The photoelectric conversion sections 51 have the same configuration as that of the photoelectric conversion sections 151 in the conventional solid-state imaging device shown in FIGS. 1 to 6. In other words, the configuration of the area A in FIG. 16 is the same as that shown in FIGS. 1 to 6. Therefore, no description about the sections 51 is provided here.

Figure 1:
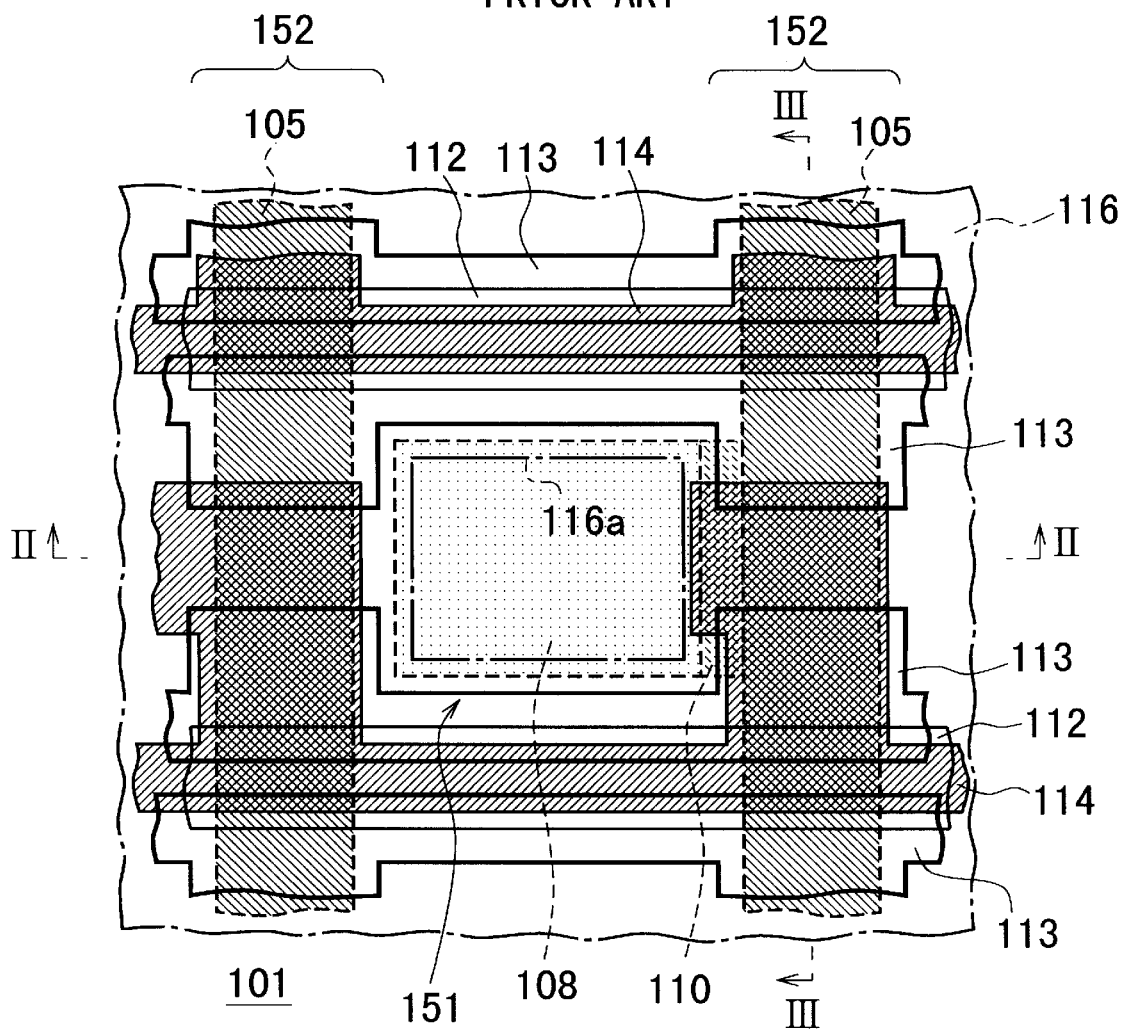
FIG. 1 is a plan view of one of photoelectric conversion sections and its neighborhood of a conventional two-dimensional solid-state imaging device of the progressive-scan interline-transfer type.
Figure 2:
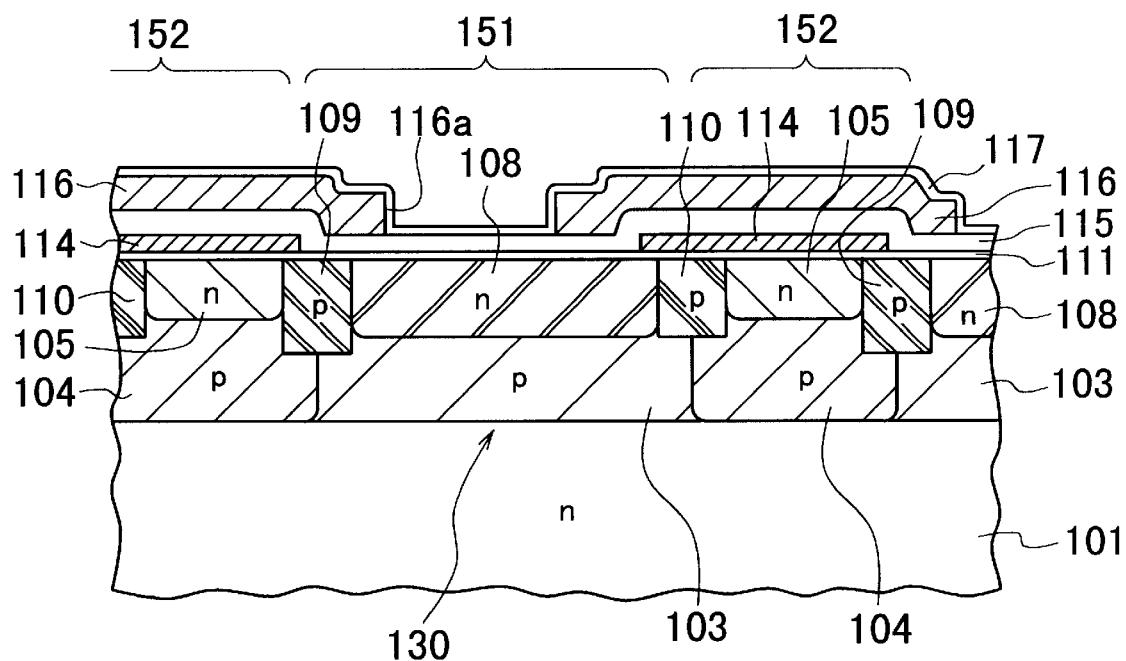
FIG. 2 is a cross-sectional view along the line II—II in FIG. 1.
Figure 3:
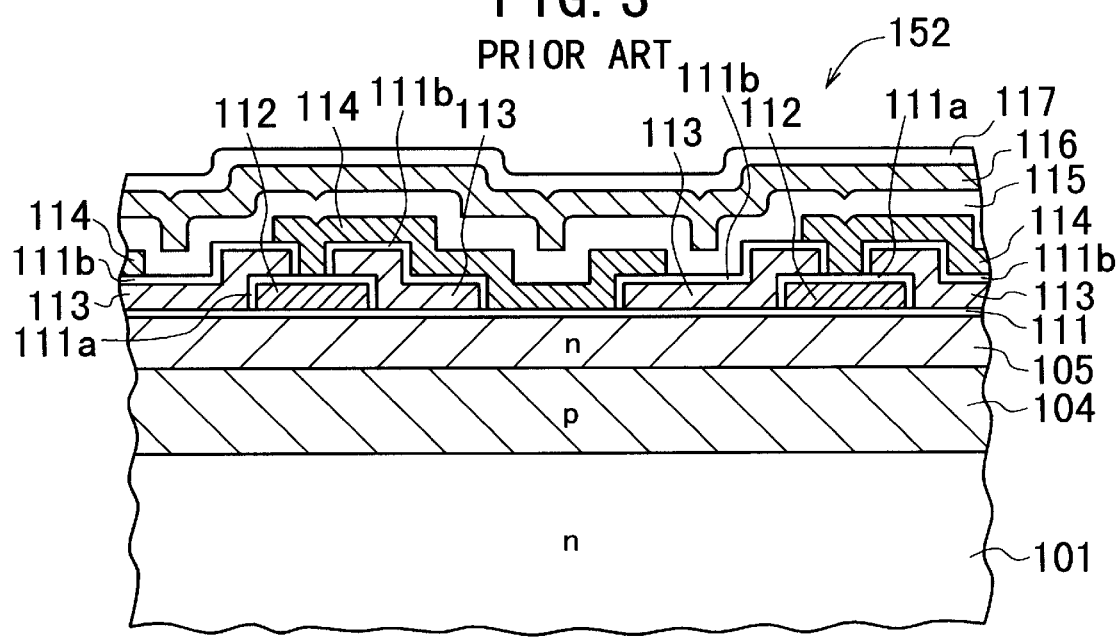
FIG. 3 is a cross-sectional view along the line III—III in FIG. 1.
Figure 4:
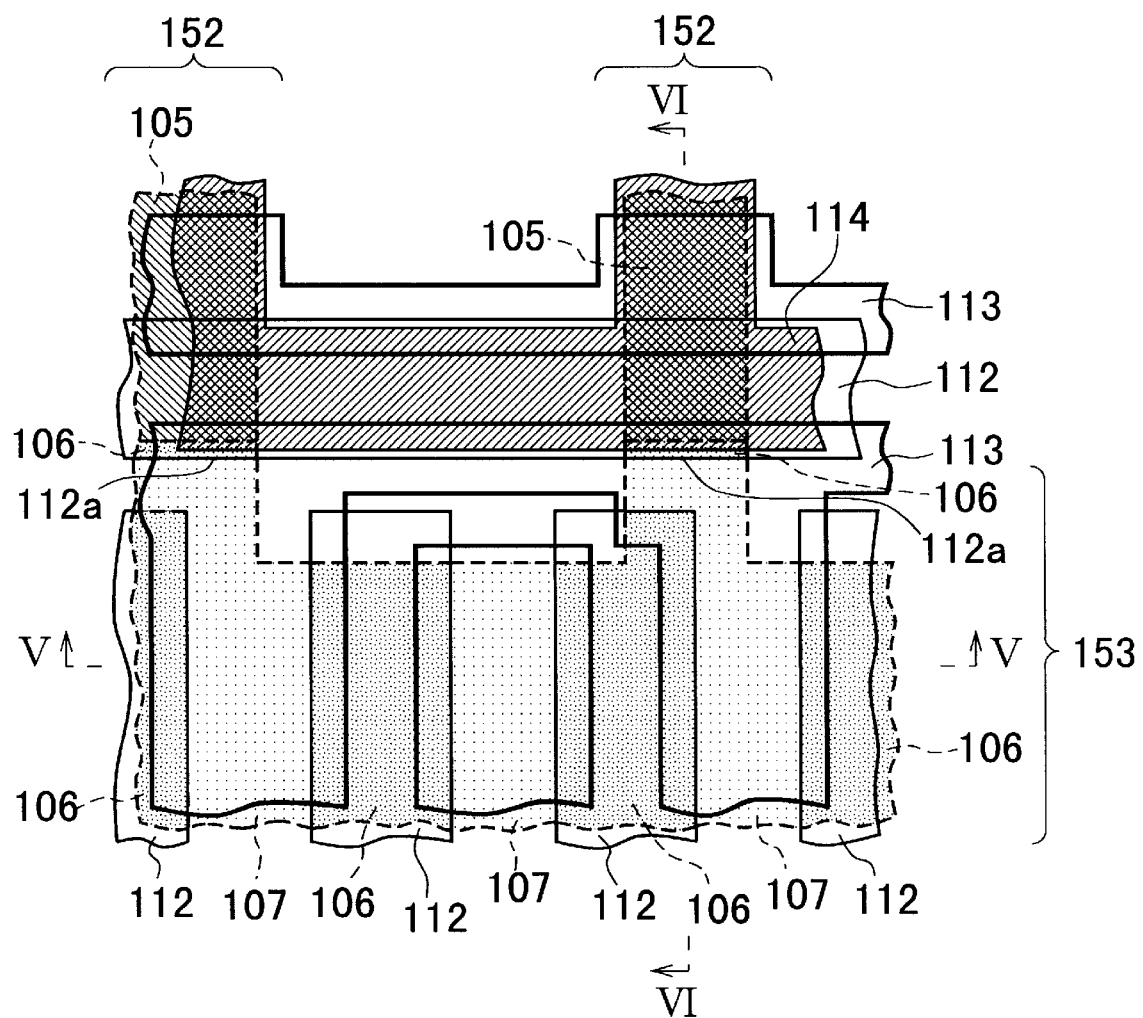
FIG. 4 is a plan view of an interconnection area between one of single-channel vertical charge-transfer sections and a two-channel horizontal charge-transfer section of the conventional two-dimensional solid-state imaging device.
Figure 5:
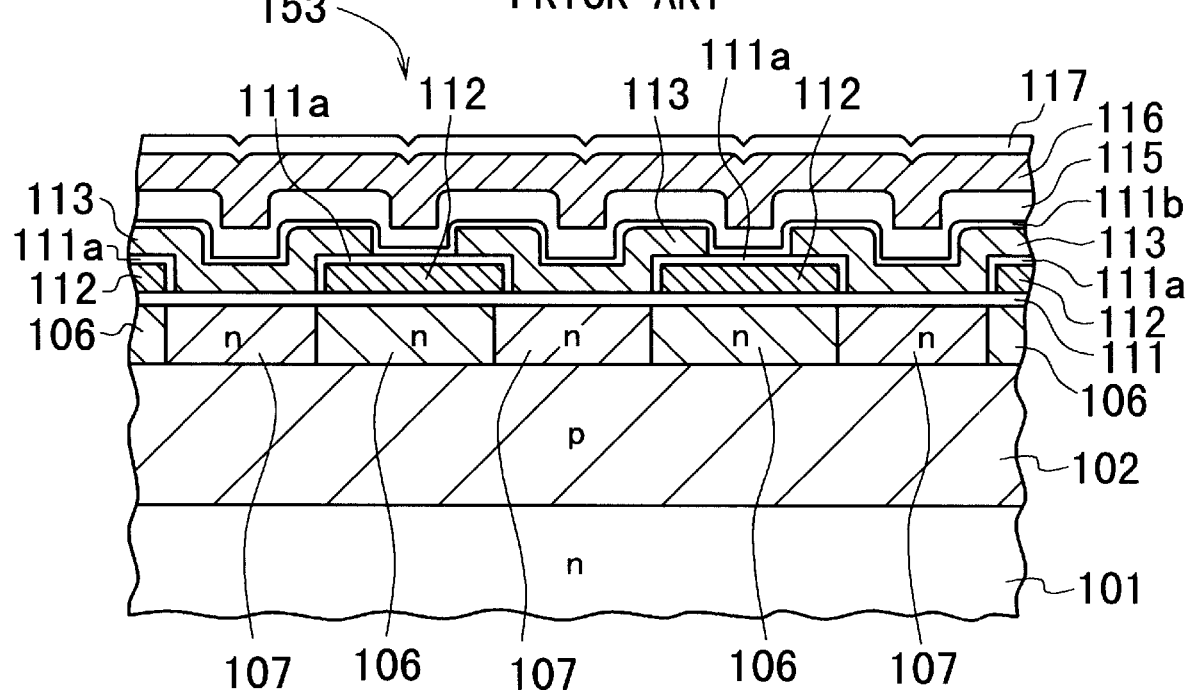
FIG. 5 is a cross-sectional view along the line V—V in FIG. 4.
Figure 6:
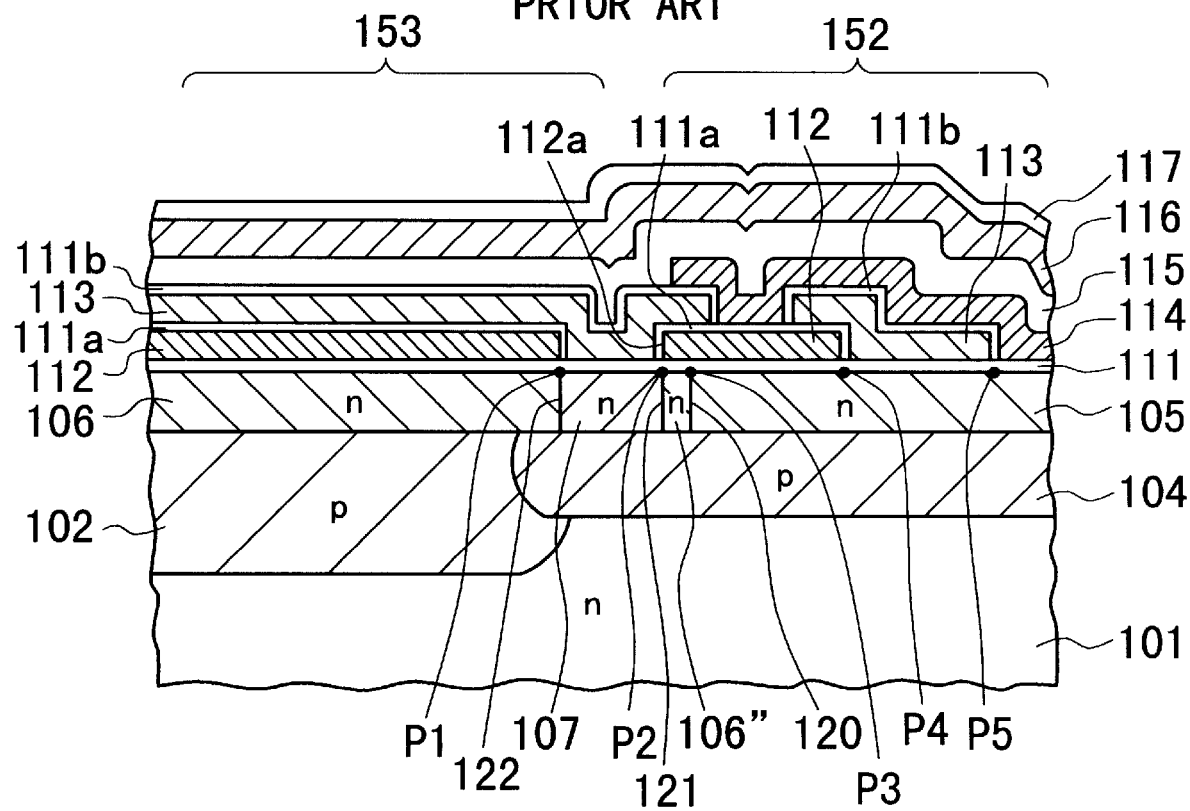
FIG. 6 is a cross-sectional view along the line VI—VI in FIG. 4.
Figure 7A:
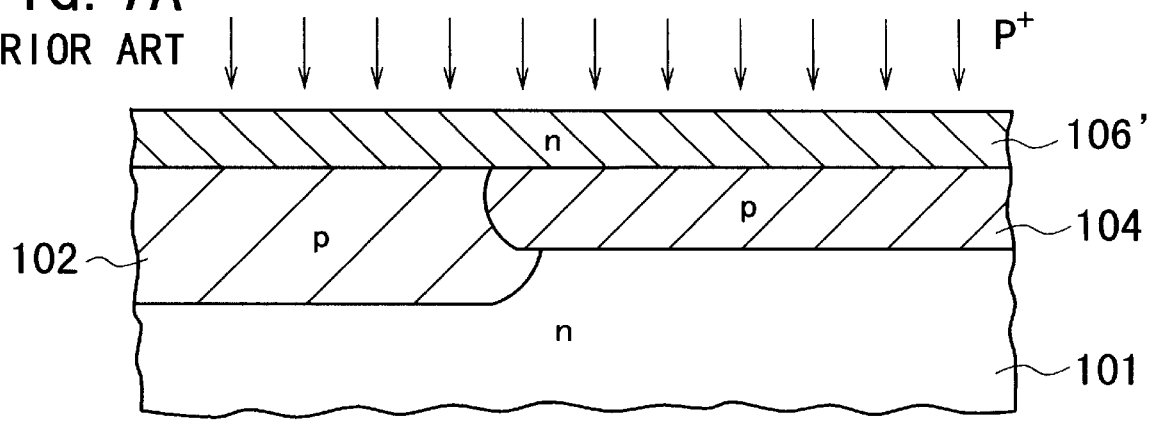
FIGS. 7A to 7C are cross-sectional views along the line VI—VI in FIG. 4, which show the fabrication process steps of the conventional solid-state imaging device in FIGS. 1 to 6, respectively.
Figure 7B:
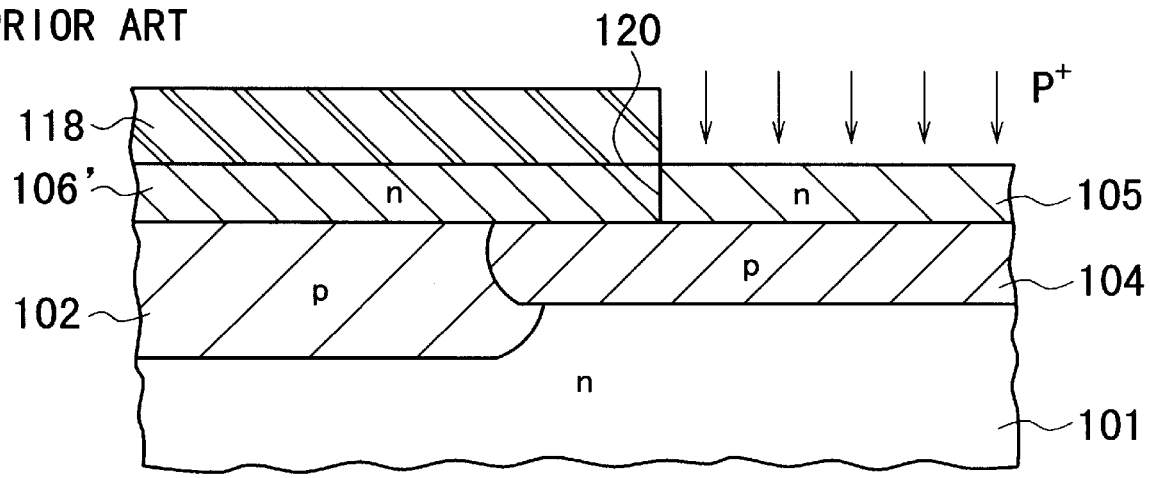
Figure 7C:
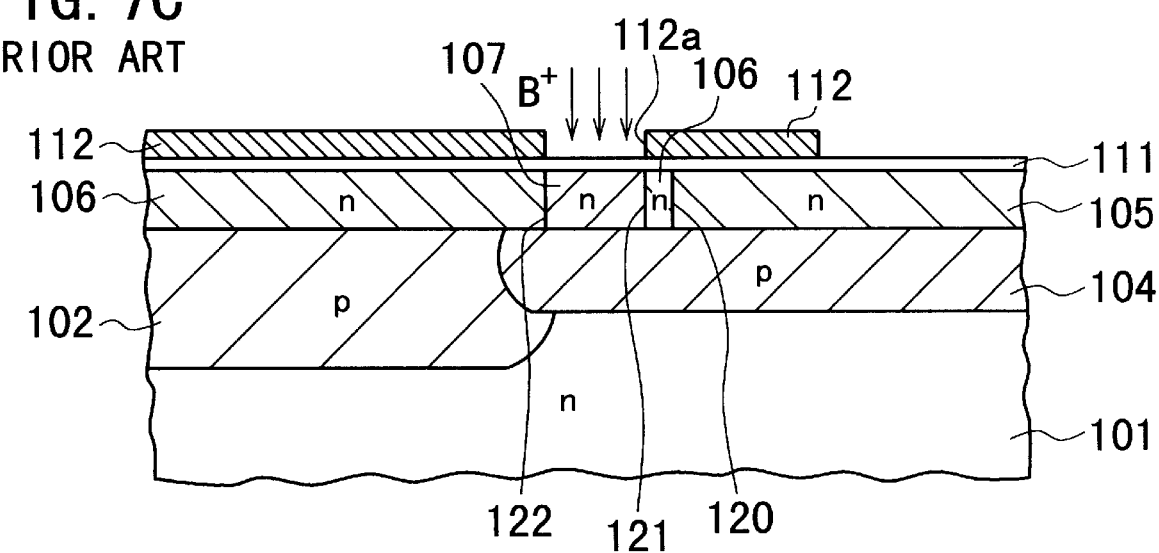
Figure 9:
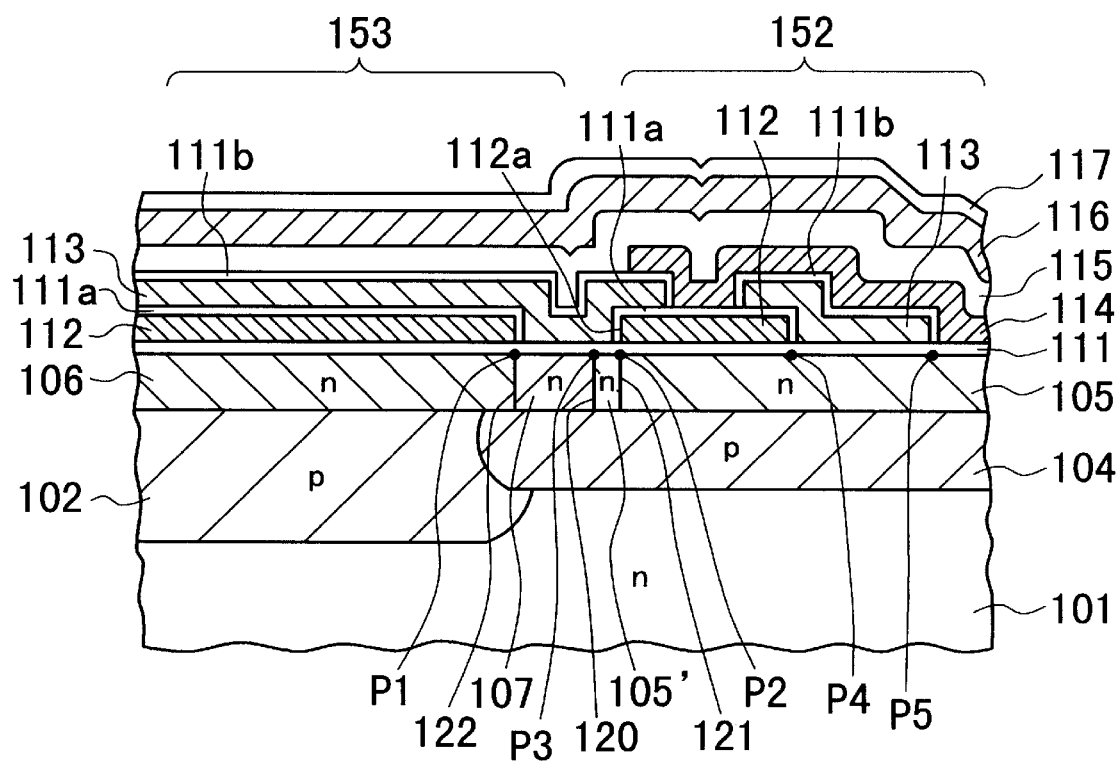
FIG. 9 is a cross-sectional view along the line VI—VI in FIG. 4, in which the interfaces between the n-type buried channel regions in the vertical charge-transfer sections and the n-type buried channel region in the horizontal charge-transfer section are located outside the gate electrodes in the vertical charge-transfer sections.
Figure 10:
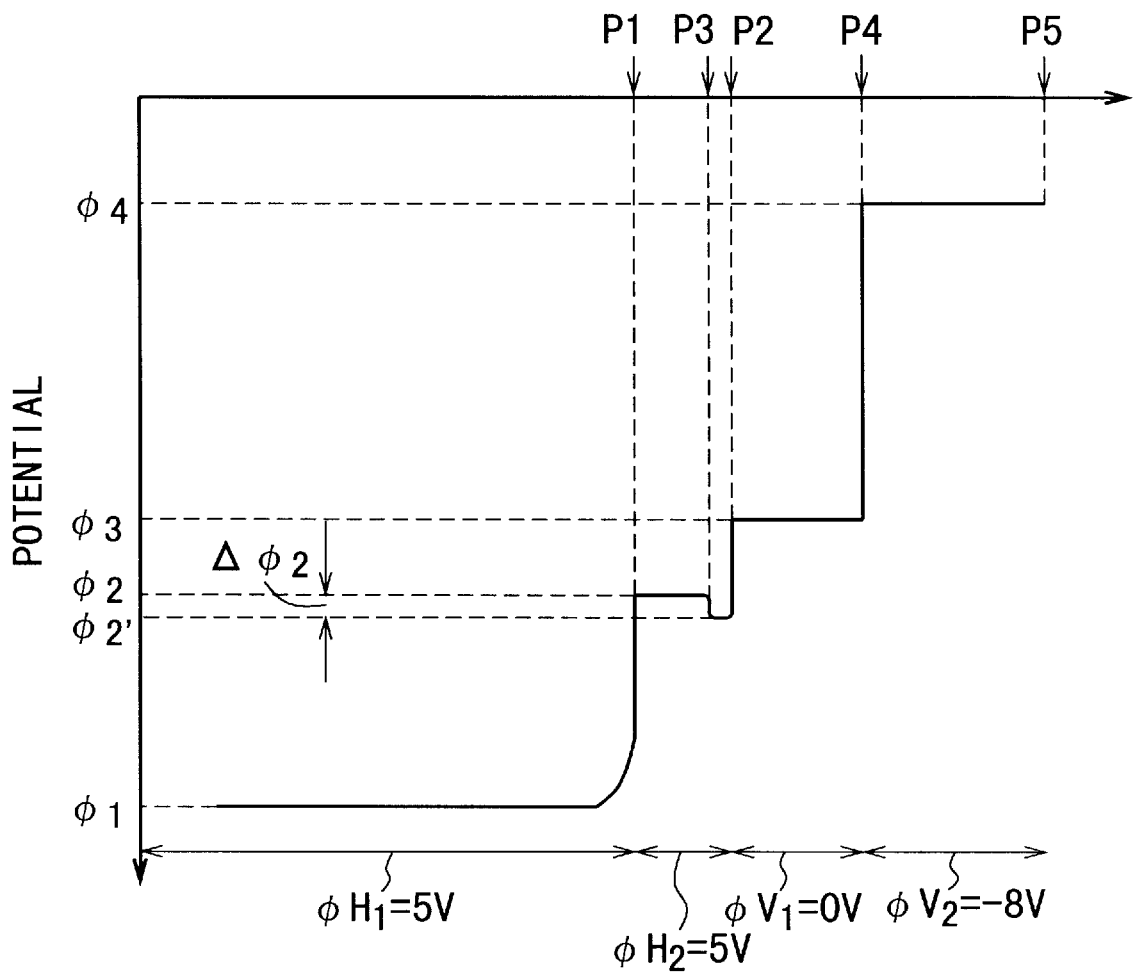
FIG. 10 is a diagram showing the relationship of the electric potential with the position of the conventional solid-state imaging device in FIG. 1 to 6, which is in the state of FIG. 9.
Figure 11:
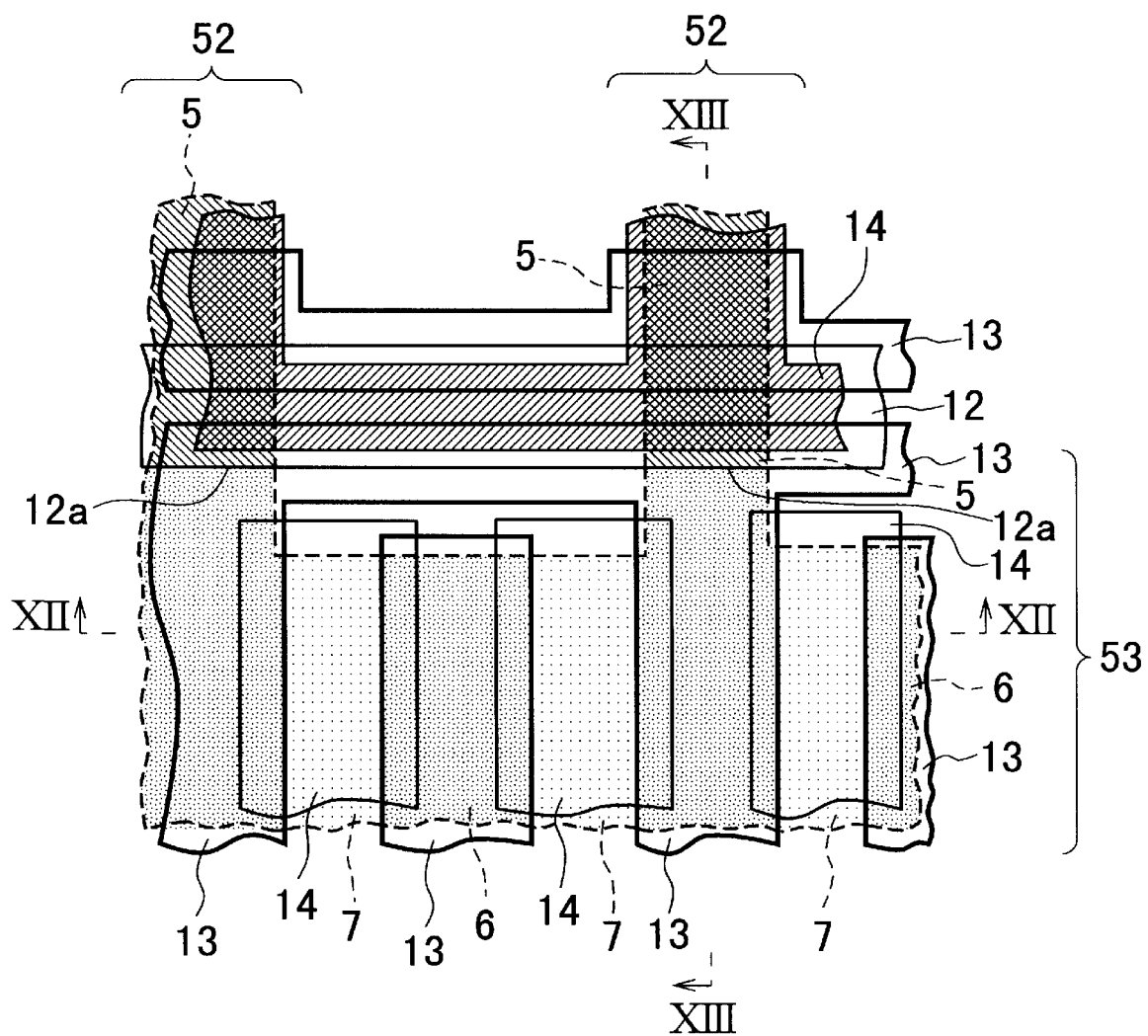
FIG. 11 is a plan view of an interconnection area between one of single-channel vertical charge-transfer sections and a two-channel horizontal charge-transfer section of a two-dimensional solid-state imaging device according to an embodiment of the present invention.
Figure 12:
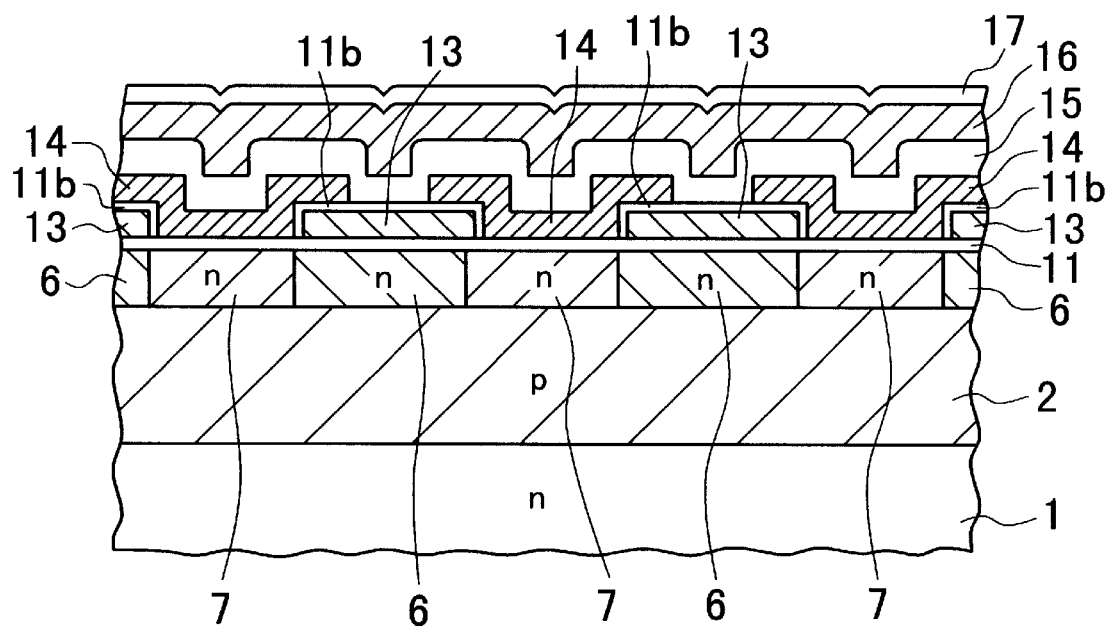
FIG. 12 is a cross-sectional view along the line XII—XII in FIG. 11.
Figure 13:
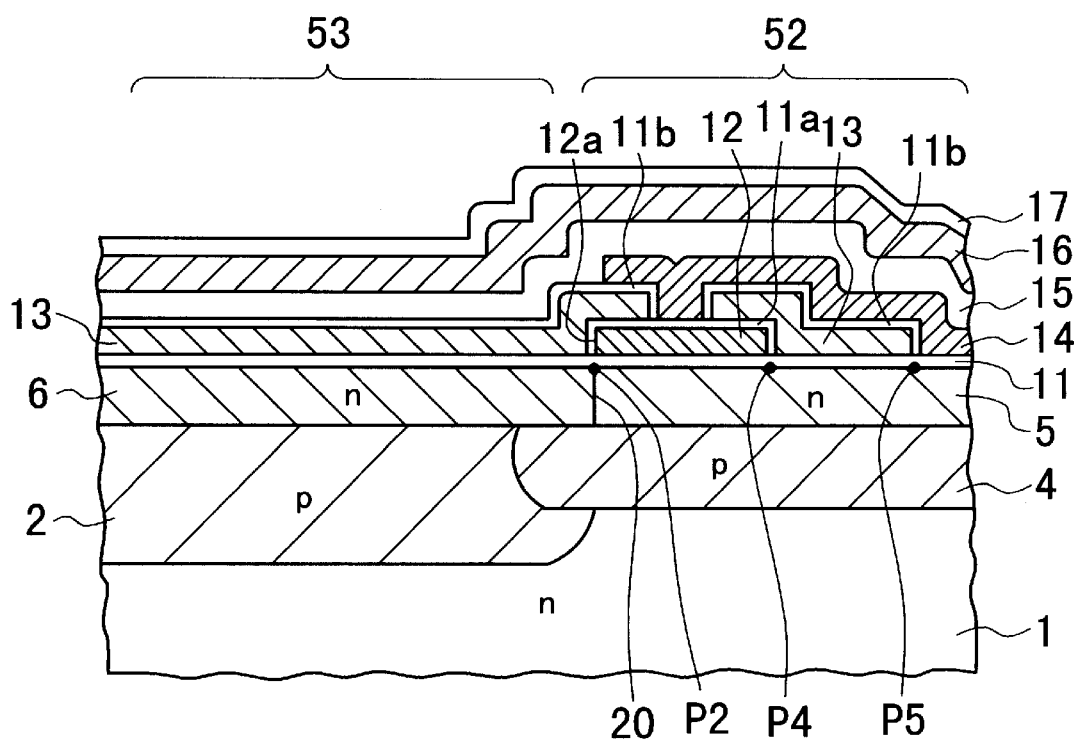
FIG. 13 is a cross-sectional view along the line XIII—XIII in FIG. 11.

FIGS. 11, 12, and 13 show the detailed configuration of the area B in FIG. 16.

As shown in FIGS. 11, 12, and 13, p-type wells 2 and 4 are formed in a surface region of an n-type silicon substrate 101. The elongated p-type well 2 is formed in the horizontal charge-transfer section 53 to extend along the section 53. The elongated p-type wells 4 are located in the respective vertical charge-transfer sections 52 to extend along the corresponding sections 52.

The p-type wells 2 and 4 have the same depth and doping concentration as those in the above conventional solid-state imaging device shown in FIGS. 1 to 6. Specifically, the p-type well 2 in the horizontal charge-transfer section 53 has a depth of approximately 4 $\mu$m. The p-type well (not shown) in the photoelectric conversion sections 51 has a depth of approximately 2 $\mu$m. The p-type well 4 in the vertical charge-transfer sections 52 has a depth of approximately 2 $\mu$m.

In the vertical charge-transfer sections 52, as shown in FIGS. 11 to 13, elongated n-type buried channel regions 5 are formed in the respective p-type wells 4 to extend along the corresponding wells 4.

In the horizontal charge-transfer sections 53, as shown in FIGS. 11 to 13, n-type buried channel regions 6 and 7 are formed in the p-type well 2. The buried channel regions 6 and 7 are alternately arranged along the well 2. The buried channel regions 6 serve as charge-storage regions for storing signal charges. The buried channel regions 7 serve as charge-barrier regions for confining the signal charges in the adjoining charge-storage regions.

The n-type buried channel regions 6 have a doping concentration slightly greater than that of the n-type buried channel regions 7. The doping concentrations of the n-type buried channel regions 6 and 7, which are determined according to the doping concentration of the corresponding p-type well 2, are less than that of the n-type buried channel regions 5.

A gate oxide film 11 is formed on the surface of the substrate 1 to cover the photoelectric conversion sections 51, the vertical charge-transfer sections 52, and the horizontal charge-transfer section 53.

First, second, and third patterned polysilicon films 12, 13, and 14 are formed on the gate oxide film 11 in the photoelectric conversion sections 51 and the vertical and horizontal charge-transfer sections 52 and 53. These polysilicon films 12, 13, and 14 serve as gate electrodes and wiring lines. Parts of the polysilicon films 12, 13, and 14 which are contacted with the gate oxide film 11 serve as the gate electrodes. Parts of the polysilicon films 12, 13, and 14 which are not contacted with the gate oxide film 11 serve as the wiring lines.

The buried channel region 5, the corresponding gate electrodes, and the gate oxide film 11 in each of the vertical charge-transfer sections 52 constitute the vertical CCD register driven by a four-phase driving signal. The buried channel region 2, the corresponding gate electrodes, and the gate oxide film 11 in the horizontal charge-transfer section 53 constitute the horizontal CCD register driven by a two-phase driving signal.

In the vertical and horizontal charge-transfer sections 52 and 53, the second polysilicon film 13 is partially overlapped with the underlying first polysilicon film 12. Further, the third polysilicon film 14 is partially overlapped with the underlying first and second polysilicon films 12 and 13. The second polysilicon film 13 is electrically insulated from the first polysilicon film 12 by an intervening gate oxide film 11a. The third polysilicon film 14 is electrically insulated from the underlying first polysilicon film 12 by the gate oxide film 11a and from the underlying second polysilicon film 13 by a gate oxide film 11b.

An interlayer insulating film 15 is formed to cover the first, second and third polysilicon films 12, 13, and 14 in the vertical and horizontal charge-transfer sections 52 and 53.

A metal film 16 is formed on the interlayer insulating film 15 in the vertical and horizontal charge-transfer sections 52 and 53. The metal film 16 has rectangular windows (not shown) located in the respective photoelectric conversion sections 51 to allow the incident light to enter the photodiodes. The metal film 16 serves as a light shielding film and a wiring line or lines.

A cover oxide film 17 is formed on the metal film 16 in the photoelectric conversion sections 51 and the vertical and horizontal charge-transfer sections 52 and 53 to protect the inner layered structures.

A fabrication method of the above conventional solid-state imaging device is explained below with reference to FIGS. 15A to 15E showing the same cross section as that in FIG. 13.

Figure 15A:
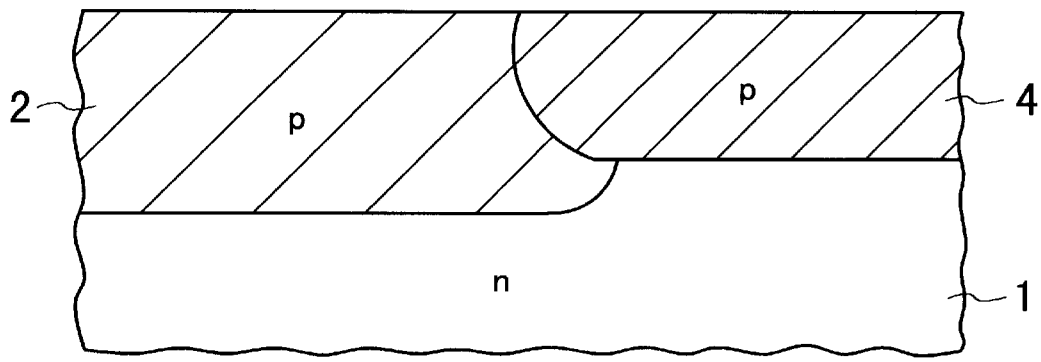
FIGS. 15A to 15E are cross-sectional views along the line XIII—XIII in FIG. 11, which show the fabrication process steps of the solid-state imaging device according to the embodiment of the present invention, respectively.

First, as shown in FIG. 15A, the p-type wells 2, which are located in the horizontal charge-transfer section 53, are formed in the surface region of the n-type silicon substrate 1. Then, the p-type wells (not shown), which are located in the photoelectric conversion sections 51, are formed in the surface region of the substrate 1. Further, the p-type wells 4, which are located in the vertical charge-transfer sections 52, are formed in the surface region of the substrate 1.

Subsequently, phosphorus ions are selectively implanted into the p-type wells of the photoelectric conversion regions 51 as an n-type impurity, forming the n-type diffusion regions of the photodiodes in the photoelectric conversion regions 51. Then, boron ions are selectively implanted into the substrate 1 to form the p-type channel stop regions and the p-type read-out gate regions.

Figure 15B:
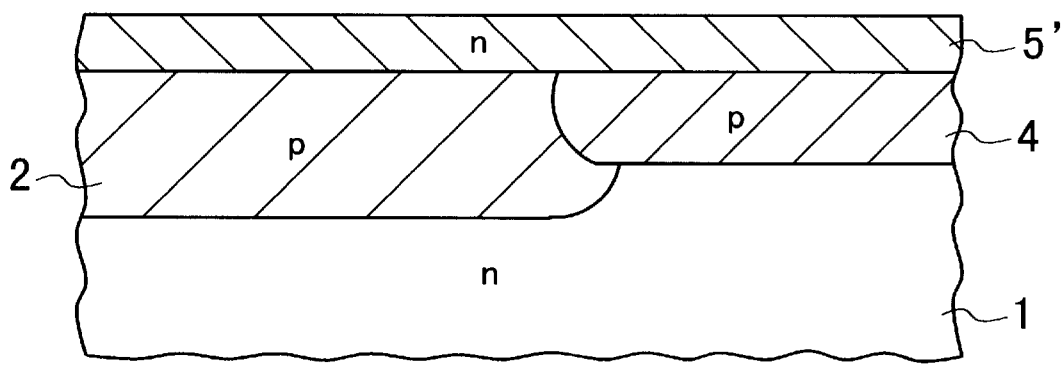

Next, phosphorus ions are selectively implanted into the p-type wells 4 and 2 in the vertical and horizontal charge-transfer sections 52 and 53, forming an n-type region 5' in the vertical and horizontal charge-transfer sections 52 and 53. The state at this stage is shown in FIG. 15B.

Figure 15C:
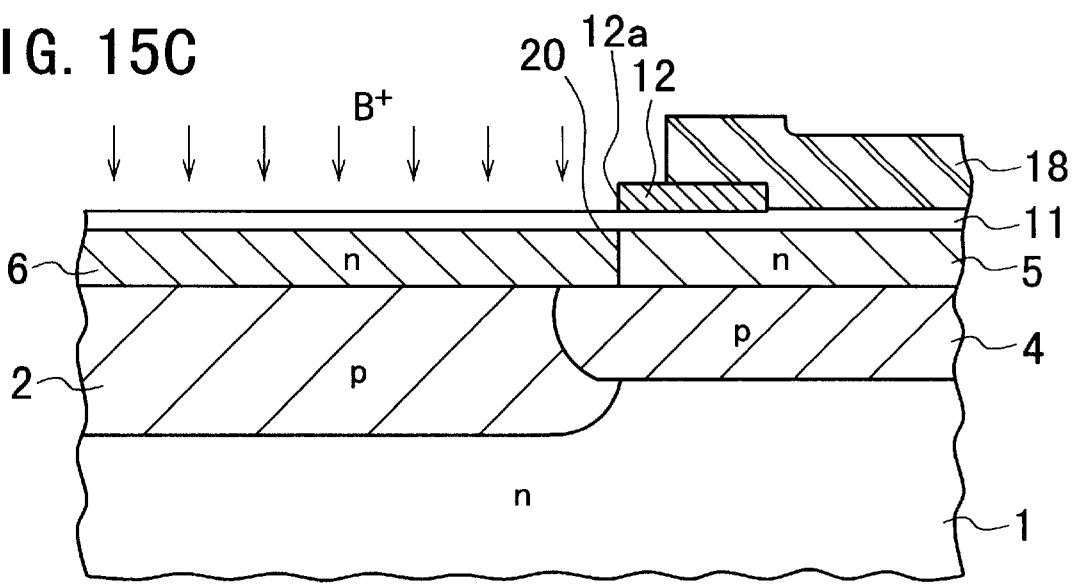

Following this, the gate oxide film 11 is formed on the substrate 1 to cover the photoelectric conversion sections 51 and the vertical and horizontal charge-transfer sections 52 and 53, as shown in FIG. 15C.

Unlike the above conventional solid-state imaging device where the first patterned polysilicon film 112 is formed on the gate oxide film 111 in the vertical and horizontal charge-transfer sections 152 and 153, the first patterned polysilicon film 12 is then formed on the gate oxide film 11 in the vertical charge-transfer sections 52 only. The first polysilicon film 12 serves as the gate electrodes for applying one of the four driving voltages to the vertical CCD registers in the vertical charge-transfer sections 52.

After a patterned resist film 18 uncovering the horizontal charge-transfer sections 53 only is formed on the gate oxide film 11, boron ions are selectively implanted into the n-type region 5' using the resist film 18 as a mask, forming the n-type buried channel regions 5 and 6, as shown in FIG. 15C. The implanted boron atoms decreases the n-type doping concentration of the n-type buried channel regions 6. Thus, the n-type buried channel regions 6 have a doping concentration less than that of the n-type buried channel region 5. The n-type buried channel regions 6 and 7 are alternately arranged along the horizontal charge-transfer section 53. The resist film 18 is then removed.

The interface 20 between each of the n-type buried channel regions 5 and the n-type buried channel region 6 is determined in self-alignment with the first polysilicon film 12. In other words, the interface 20 is located just below a corresponding edge 12a of the first polysilicon film 12 near the interconnection area of the vertical charge-transfer sections 51 and the horizontal charge-transfer section 52. To ensure this configuration, the edge 12a of the first polysilicon film 12 needs to be exposed from the resist film 18 during the ion-implantation step shown in FIG. 15C.

Figure 15D:
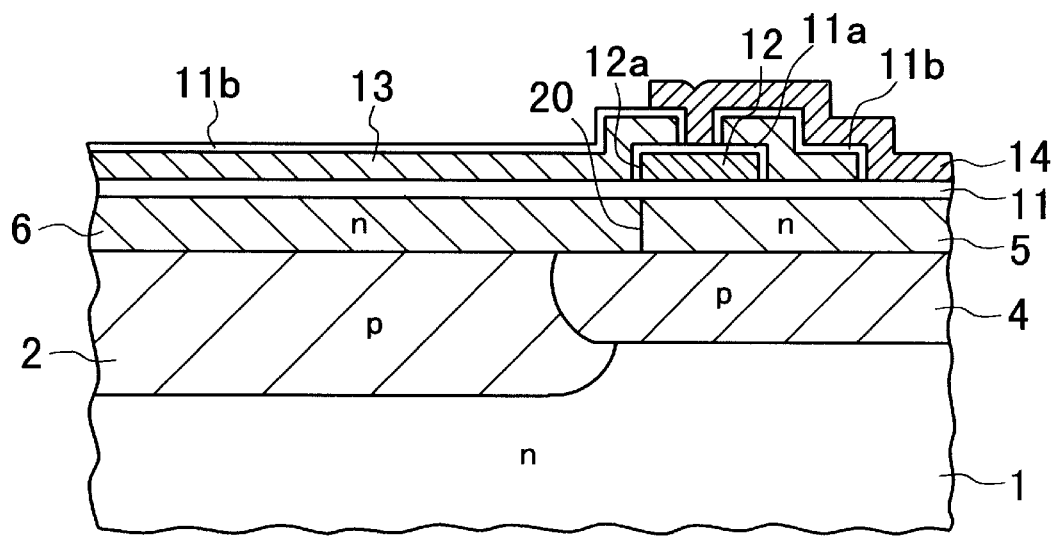

Subsequently, the gate oxide film 11a is selectively formed on the surface of the first polysilicon film 12, and then, the second patterned polysilicon film 3 is formed on the gate oxide films 11 and 11a in the vertical and horizontal charge-transfer sections 52 and 53, as clearly shown in FIGS. 15D. The second patterned polysilicon film 13 serves as the gate electrodes for applying remaining two ones of the four driving voltages to the vertical CCD registers in the vertical charge-transfer sections 52 and the gate electrodes for applying one of the two driving voltages to the horizontal CCD register in the horizontal charge-transfer section 53. These gate electrodes in the horizontal charge-transfer section 53 are located on the n-type buried channel regions 6 serving as the charge-storage regions.

Figure 15E:
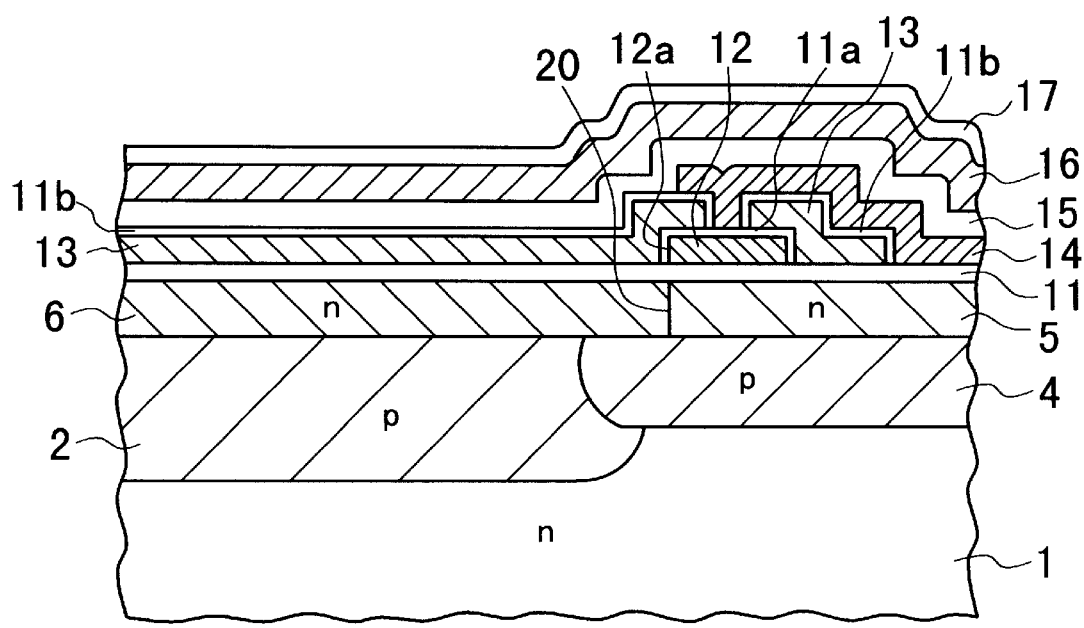

Then, the gate oxide film 11b is selectively formed on the surface of the second polysilicon film 13, and the third patterned polysilicon film 14 is formed on the gate oxide films 11, 11a, and 11b, as clearly shown in FIG. 15E. The third patterned polysilicon film 14 serves as the gate electrodes for applying the remaining one of the four driving voltages to the vertical CCD registers in the vertical charge-transfer sections 52, the read-out gates in the photoelectric conversion section 51, and the gate electrodes for applying another one of the two driving voltages to the horizontal CCD register in the horizontal charge-transfer section 53. These gate electrodes in the horizontal charge-transfer section 53 are located on the n-type buried channel regions 7 serving as the charge-barrier regions.

Following this step, the interlayer insulating film 15 is formed to cover the photoelectric conversion section 51 and the vertical and horizontal charge-transfer sections 52 and 53. The metal film 16 serving as the light-shield and the wiring line is formed on the interlayer insulating film 15. The cover oxide film 17 is formed on the metal film 16.

Thus, the solid-state imaging device according to the embodiment of the present invention is fabricated.

With the solid-state imaging device according to the embodiment of the present invention, the n-type buried channel regions 5 in the vertical charge-transfer sections 52 are connected to the n-type buried channel region 6 in the horizontal charge-transfer section 53 so that the interfaces 20 between the buried channel regions 5 and 6 are located to be aligned with the corresponding ends 12a of the gate electrodes formed by the first polysilicon film 12.

Therefore, no potential dip nor potential barrier are generated in the vicinity of the interconnection areas between the buried channel regions 5 and 6. This means that no transfer error of the signal charges will occur during the transfer process from the vertical charge-transfer sections 52 to the horizontal charge-transfer section 53.

Figure 14:
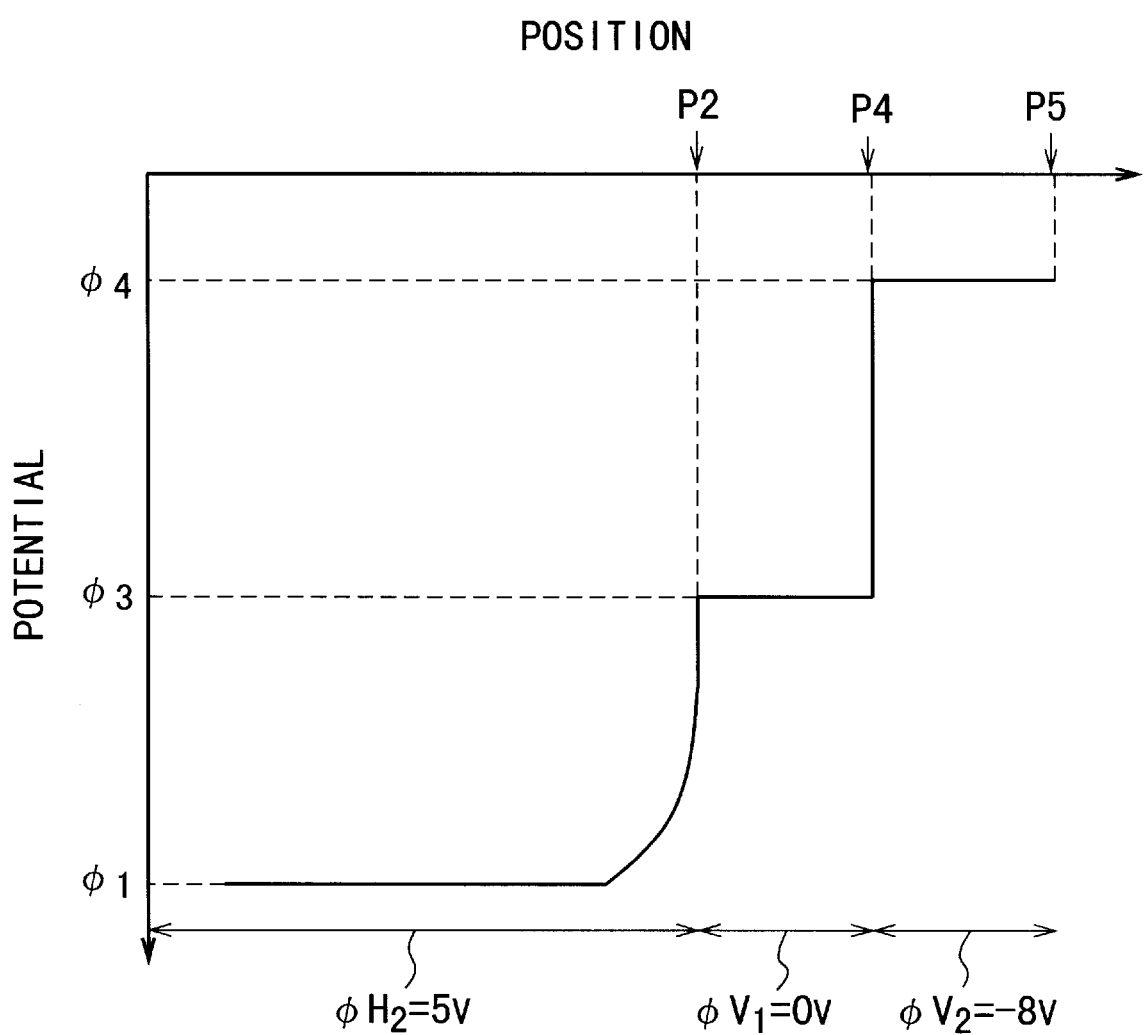
FIG. 14 is a diagram showing the relationship of the electric potential with the position of the solid-state imaging device according to the embodiment of the present invention.

Specifically, as shown in FIG. 14, the n-type buried channel regions 5 have a constant electric potential φ3 between the points P2 and P4. It is seen from FIG. 14 that no potential barrier nor potential dip is generated in the buried channel regions 5.

The vertical charge-transfer sections 52 and the horizontal charge-transfer section 53 have the n-type buried channel regions in the above embodiment. However, it is needless to say that they may have p-type buried channel regions. Also, the solid-state imaging device according to the above embodiment is of the progressive-scan interline-transfer type. However, the present invention may be applied to any other type of solid-state imaging devices.

Although the vertical charge-transfer sections 52 are driven by the four-phase driving signal and the horizontal charge-transfer section 53 are driven by the two-phase driving signal in the above embodiment, it is needless to say that any other driving signals and gate electrode configurations may be used for this device.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A solid-state imaging device comprising:

photoelectric converter elements arranged in a matrix array;

vertical charge-transfer sections arranged along respective columns of said matrix array;

a horizontal charge-transfer section disposed at output-side ends of said vertical charge-transfer sections;

an output section disposed at an output-side end of said horizontal charge-transfer section;

said photoelectric converter elements converting incident light to electric signal charges;

said vertical charge-transfer sections transferring said signal charges to said horizontal charge-transfer section according to a first driving signal;

said horizontal charge-transfer section transferring said signal charges to said output section according to a second driving signal, generating an output electric signal;

said vertical charge-transfer sections including a first plurality of buried channel regions extending along said respective vertical charge-transfer sections and a first plurality of gate electrodes arranged along said respective vertical charge-transfer sections over said first plurality of buried channel regions, said first buried channel regions extending from corresponding ends of said first plurality of gate electrodes;

said horizontal charge-transfer section including a second buried channel region extending along said horizontal charge-transfer section and a second plurality of gate electrodes arranged along said horizontal charge-transfer section over said second buried channel region;

said second buried channel region having a same conductivity type as that of said first plurality of buried channel regions and a different doping concentration from that of said first plurality of buried channel regions; and said first plurality of buried channel regions being connected to said second buried channel region via a single interface between each of said first plurality of buried channel regions and a corresponding one of said second buried channel region, said single interface being aligned with one of said corresponding ends of said first plurality of gate electrodes.

2. A solid state imaging device, comprising:

a plurality of photoelectric converter elements arranged in a matrix array;

a plurality of first charge transfer sections, each being electrically coupled to a subset of said photoelectric converter elements and each having associated therewith one of a plurality of first buried channel regions;

a second charge transfer section electrically coupled to at least a subset of said first charge transfer sections, said coupling being provided by said first buried channel regions and by a plurality of second buried channel regions associated with said second charge transfer section; and a gate electrode, disposed about said buried channel regions, said gate electrode having an edge that is aligned with a single interface between said each of first and second buried channel regions, wherein said gate electrode extends from said single interface.

3. A solid sate imaging device, according to claim 2 wherein said buried channel regions associated with said first charge transfer sections have a same conductivity type as said buried channel regions associated with said second charge transfer section.

4. A solid state imaging device, according to claim 3, wherein said buried channel regions are n-type semiconductor material and wherein said buried channel regions associated with said second transfer section are implanted with impurities using said gate electrode as a mask.

5. A solid state imaging device, comprising:
- a plurality of charge transfer sections, at least some of which are electrically coupled to a plurality of photoelectric converter elements;
- a plurality of channel sections having a same conductivity type, each of said channel sections being electrically coupled to portions of said transfer sections;
- at least one gate electrode disposed about said channel sections; and
- an single interface in each of said channel sections between a first portion associated with a first one of said transfer sections and a second portion associated with a second one of said transfer sections being electrically connected to said first one of said transfer sections, wherein said gate electrode extends from said single interface.

6. A solid state imaging device, according to claim 5, wherein said channel sections are n-type semiconductor material.

7. A solid state imaging device, according to claim 5, wherein a first subset of said transfer sections are oriented substantially in a first direction and a second subset of said transfer sections are oriented substantially in a second direction, said first and second directions being substantially orthogonal, and wherein said channel sections are formed between transfer sections selected from each of said first and second subsets.

* * * * *